United States Patent
Higginson et al.

(10) Patent No.: US 10,192,858 B2
(45) Date of Patent: *Jan. 29, 2019

(54) LIGHT EMITTING STRUCTURE

(71) Applicant: Apple Inc., Cupertino, CA (US)

(72) Inventors: John A. Higginson, Santa Clara, CA (US); Andreas Bibl, Los Altos, CA (US); Hsin-Hua Hu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/911,693

(22) Filed: Mar. 5, 2018

(65) Prior Publication Data

US 2018/0197844 A1 Jul. 12, 2018

Related U.S. Application Data

(60) Continuation of application No. 15/405,042, filed on Jan. 12, 2017, now Pat. No. 9,911,722, which is a
(Continued)

(51) Int. Cl.
*H01L 29/205* (2006.01)
*H01L 25/16* (2006.01)
(Continued)

(52) U.S. Cl.
CPC ........ *H01L 25/167* (2013.01); *H01L 23/3171* (2013.01); *H01L 25/0753* (2013.01);
(Continued)

(58) Field of Classification Search
CPC ... H01L 25/0753; H01L 25/167; H01L 25/50; H01L 27/1248; H01L 27/1262;
(Continued)

(56) References Cited

U.S. PATENT DOCUMENTS 5,592,358 A 1/1997 Shamouilian et al.
5,839,187 A 11/1998 Sato et al.
(Continued)

FOREIGN PATENT DOCUMENTS

JP 3406207 5/1999
WO WO 2011/123285 10/2011

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Long K Tran
(74) *Attorney, Agent, or Firm* — Jaffery Watson Mendonsa & Hamilton LLC

(57) ABSTRACT

A method and structure for receiving a micro device on a receiving substrate are disclosed. A micro device such as a micro LED device is punched-through a passivation layer covering a conductive layer on the receiving substrate, and the passivation layer is hardened. In an embodiment the micro LED device is punched-through a B-staged thermoset material. In an embodiment the micro LED device is punched-through a thermoplastic material.

20 Claims, 14 Drawing Sheets

Related U.S. Application Data continuation of application No. 15/008,372, filed on Jan. 27, 2016, now Pat. No. 9,589,944, which is a continuation of application No. 14/563,763, filed on Dec. 8, 2014, now Pat. No. 9,263,627, which is a division of application No. 13/562,184, filed on Jul. 30, 2012, now Pat. No. 8,933,433.

(51) Int. Cl.
*H01L 33/44* (2010.01)
*H01L 23/31* (2006.01)
*H01L 33/06* (2010.01)
*H01L 33/00* (2010.01)
*H01L 33/42* (2010.01)
*H01L 33/62* (2010.01)
*H01L 25/075* (2006.01)
*H01L 27/12* (2006.01)
*H01L 25/00* (2006.01)
*H01L 33/54* (2010.01)
*H01L 21/56* (2006.01)

(52) U.S. Cl.
CPC .......... *H01L 25/50* (2013.01); *H01L 27/1214* (2013.01); *H01L 27/1248* (2013.01); *H01L 27/1262* (2013.01); *H01L 33/005* (2013.01); *H01L 33/06* (2013.01); *H01L 33/42* (2013.01); *H01L 33/44* (2013.01); *H01L 33/54* (2013.01); *H01L 33/62* (2013.01); *H01L 21/56* (2013.01); *H01L 2924/0002* (2013.01); *H01L 2933/005* (2013.01); *H01L 2933/0016* (2013.01); *H01L 2933/0025* (2013.01); *H01L 2933/0033* (2013.01); *H01L 2933/0066* (2013.01)

(58) Field of Classification Search
CPC ....... H01L 2933/0033; H01L 2933/005; H01L 33/06; H01L 33/42; H01L 33/54; H01L 33/62
USPC ....... 257/9, 14, 91; 228/122.1, 123.1, 124.5, 228/178, 179.1
See application file for complete search history.

(56) References Cited

U.S. PATENT DOCUMENTS

| | | |
|---|---|---|
| 5,851,664 A | 12/1998 | Bennett et al. |
| 5,888,847 A | 3/1999 | Rosoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,878,607 B2 | 4/2005 | Inoue et al. |
| 7,015,055 B2 * | 3/2006 | Oohata .................. G09F 9/33 438/108 |
| 7,033,842 B2 | 4/2006 | Haji et al. |
| 7,148,127 B2 | 12/2006 | Oohata et al. |
| 7,199,397 B2 | 4/2007 | Huang et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,472,472 B2 | 1/2009 | Takanami |
| 7,585,703 B2 | 9/2009 | Matsumura et al. |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,999,454 B2 | 8/2011 | Winters et al. |
| 8,023,248 B2 | 9/2011 | Yonekura et al. |
| 8,497,143 B2 | 7/2013 | Han |
| 8,497,512 B2 | 7/2013 | Nakamura et al. |
| 9,466,621 B2 | 10/2016 | Chou |
| 2001/0029088 A1 | 10/2001 | Odajima et al. |
| 2002/0076848 A1 | 6/2002 | Spooner et al. |
| 2003/0040142 A1 | 2/2003 | Lin et al. |
| 2003/0177633 A1 | 9/2003 | Haji et al. |
| 2005/0017256 A1 | 1/2005 | Slater, Jr. et al. |
| 2005/0233546 A1 * | 10/2005 | Oohata .................. G09F 9/33 438/458 |
| 2006/0169993 A1 | 8/2006 | Fan et al. |
| 2008/0163481 A1 | 7/2008 | Shida et al. |
| 2009/0140282 A1 | 6/2009 | Wu et al. |
| 2009/0230383 A1 | 9/2009 | Meng et al. |
| 2009/0314991 A1 | 12/2009 | Cho et al. |
| 2010/0188794 A1 | 7/2010 | Park et al. |
| 2010/0248484 A1 | 9/2010 | Bower et al. |
| 2011/0003410 A1 | 1/2011 | Tsay et al. |
| 2011/0242083 A1 | 10/2011 | Chiou |
| 2011/0284867 A1 | 11/2011 | Tran et al. |
| 2012/0018746 A1 | 1/2012 | Hsieh |
| 2012/0134065 A1 | 5/2012 | Furuya et al. |
| 2012/0153312 A1 | 6/2012 | Chou |
| 2012/0168776 A1 | 7/2012 | Nakamura et al. |
| 2012/0326188 A1 | 12/2012 | Han |
| 2013/0126081 A1 | 5/2013 | Hu et al. |
| 2013/0126891 A1 | 5/2013 | Bibl et al. |
| 2013/0187179 A1 | 7/2013 | Tan et al. |
| 2013/0273695 A1 * | 10/2013 | Menard ............... H01L 21/6835 438/118 |
| 2013/0285086 A1 | 10/2013 | Hu et al. |
| 2013/0316529 A1 | 11/2013 | Golda et al. |
| 2014/0159064 A1 | 6/2014 | Sakariya et al. |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, Oct. 8-12,, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

(56) References Cited

OTHER PUBLICATIONS

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping For Next Generation Semiconductor Devices" Apr. 21, 1999, 4 pgs.

Furman, et al., "A High Concentration Photovoltaic Module Utilizing Micro-Transfer Printing and Surface Mount Technology" Photovoltaic Specialists Conference (PVSC), 2010 35th IEEE, 2010, pp. 000475-000480.

Hekmatshoar, et al., "A novel TFT-OLED integration for OLED-independent pixel programming in amorphous-Si AMOLED pixels" Journal of the SID 16/1, 2008, pp. 183-188.

Sarma, et al., "Active Matrix OLED Using 150oC a-Si TFT Backplane Built on Flexible Plastic Substrate" Presented at SPIE Symp. on Aerospace/Defense Sensing, Orlando, FL, Apr. 2003, and to be published in SPIE Proc. vol. 5080, paper 24 (2003), 12 pages.

Tsujimura, et al., "4.3 Passive-Matrix OLED Display" OLED Displays: Fundamentals and Applications, 2012, pp. 91-109, John Wiley & Sons, Inc., Hoboken, New Jersey, USA.

Yoo, et al., "Flexible GaN LED on a Polymide Substrate for Display Applications" Quantum Sensing and Nanophotonic Devices IX, edited by Manijeh Razeghi, et al., 2012, Proc. of SPIE vol. 8268, pp. 82681Y-1 to 82681Y-6.

Long, K., et al., "Active-Matrix Amorphous-Silicon TFT Arrays at 180° C on Clear Plastic and Glass Substrates for Organic Light-Emitting Displays," IEEE Transactions on Electron Devices, vol. 53, No. 8, Aug. 2006, pp. 1789-1796.

Seong, Ryu-Gi, et al., "Flexible AMOLED Backplane Technology Using Pentacene TFT's," Proc. Int. Symp. Super-Functionality Organic Devices IPAP Conf. Series 6, pp. 146-149.

\* cited by examiner

LIGHT EMITTING STRUCTURE

RELATED APPLICATIONS

This application is a continuation of co-pending U.S. patent application Ser. No. 15/405,042, filed Jan. 12, 2017, which is a continuation of U.S. patent application Ser. No. 15/008,372, filed Jan. 27, 2016, now U.S. Pat. No. 9,589,944, which is a continuation of U.S. patent application Ser. No. 14/563,763, filed Dec. 8, 2014, now U.S. Pat. No. 9,263,627, which is a divisional application of U.S. patent application Ser. No. 13/562,184 filed Jul. 30, 2012, now U.S. Pat. No. 8,933,433, which is incorporated herein by reference.

BACKGROUND

Field

The present invention relates to micro devices. More particularly embodiments of the present invention relate to a method and structure for receiving a micro device on a receiving substrate.

Background Information

Integration and packaging issues are one of the main obstacles for the commercialization of micro devices such as radio frequency (RF) microelectromechanical systems (MEMS) microswitches, light-emitting diode (LED) display and lighting systems, MEMS, or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer. Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

Other technologies for transferring of devices include transfer printing with elastomeric stamps. In one such implementation an array of elastomeric stamps with posts matching the pitch of devices on a source wafer are brought into intimate contact with the surface of the devices on the source wafer and bonded with van der Walls interaction. The array of devices can then be picked up from the source wafer, transferred to a receiving substrate, and released onto the receiving substrate.

SUMMARY OF THE INVENTION

A method and structure for receiving a micro device on a receiving substrate are described. In an embodiment, a structure includes a substrate, a conductive layer on the substrate, and a micro LED device on the conductive layer. The micro LED device includes a micro p-n diode, a metallization stack between the micro p-n diode and the conductive layer, and a quantum well layer within the micro p-n diode. A bonding layer may optionally be formed between the metallization stack and the conductive layer. For example, the bonding layer can be a material such as indium, gold, silver, molybdenum, tin, aluminum, silicon, and alloys thereof. A thermoplastic or thermoset passivation layer laterally surrounds the quantum well layer of the micro LED device. A second conductive layer is formed on a top surface of the micro LED device. For example, the two conductive layers can be electrodes such as anode or cathode, or anode or cathode lines. A barrier layer can be formed on the second conductive layer, and a cover can be formed over the micro LED device. The cover may be conformal to a topography of the micro LED device or be a rigid cover plate. A black matrix material can be formed around the micro LED device and underneath the cover.

In an embodiment, the receiving substrate is a lighting or display substrate, and the structure can be configured to emit light from a top surface, through the substrate and a bottom surface, or both. In an embodiment, the passivation layer is transparent in the visible wavelength range, e.g. 380 nm-750 nm. For example, benzocyclobutene (BCB) and epoxy are suitable transparent thermoset materials. The first and/or second conductive layer may also be formed of a transparent material such as indium-tin-oxide (ITO) and poly(3,4-ethylenedioxythiophene) (PEDOT). The conductive layer(s) can also include nanoparticles such as silver, gold, ITO and indium-zinc-oxide (IZO). In an embodiment, one of the conductive layers is reflective to the visible wavelength range. For example, the second conductive layer may be reflective for a bottom emitting structure. Alternatively, or in addition, a layer reflective to the visible wavelength range can be formed over the micro LED device for a bottom emitting structure.

In an embodiment, the micro LED device is integrated into a pixel of a display substrate. For example, the micro LED device can be integrated into a subpixel of the pixel, where the conductive layer and second conductive layer are the anode and cathode, or vice-versa. A cover can be formed over the subpixel with a black matrix material around the micro LED device in the subpixel, and underneath the cover. In an embodiment, the micro LED device emits a primarily blue, red, or green light. An arrangement of red, blue, and green micro LED devices may be arranged in separate subpixels of an RGB pixel. In an embodiment, the micro LED device is integrated into an active matrix pixel display in which each subpixel includes working circuitry such as a switching transistor, driving transistor, and storage capacitor. For example, the switching and driving transistors can be thin film transistors. In an embodiment, the micro LED device is integrated into a passive matrix pixel display.

In an embodiment, a method of transferring a micro device to a receiving substrate includes picking up a micro device from a carrier substrate with a transfer head and placing the micro device on a conductive layer formed on the receiving substrate by punching the micro device through a passivation layer covering the conductive layer. The micro device may be picked up from the carrier substrate with a variety of manners, including applying a voltage to the transfer head to generate an electrostatic pick up pressure on the micro device. The micro device is then released from the transfer head and the passivation layer is hardened so that the hardened passivation layer laterally surrounds the micro device. A variety of micro devices can be transferred in accordance with embodiments of the invention, such as, a diode, LED, transistor, integrated circuit (IC), or microelectromechanical system (MEMS). In an embodiment, the micro device is a micro LED device including a micro p-n diode, a metallization stack between the micro p-n diode and the conductive layer, and a quantum well layer within the micro p-n diode where the hardened passivation layer laterally surrounds the quantum well layer of the micro LED device.

In an embodiment, the micro device is punched through a B-staged thermoset passivation layer which is then hardened by curing the B-staged thermoset passivation layer, for example by the application of heat or ultraviolet (UV) energy. The B-staged thermoset passivation layer may first be formed by directly applying the B-staged thermoset passivation layer, or first applying an A-staged thermoset passivation layer on the receiving substrate and covering the conductive layer, followed by partially curing the A-staged thermoset passivation layer to form the B-staged thermoset passivation layer. The B-staged thermoset passivation layer may also be heated during punch-through, which may allow the B-staged thermoset passivation layer to soften or flow to aid in the punch-through. In an embodiment, the micro device is punched through a thermoplastic passivation layer heated above its glass transition temperature, followed by cooling below its glass transition temperature to harden the thermoplastic passivation layer. For example, the thermoplastic passivation layer is heated to a temperature above the glass transition temperature but below the melting temperature of the thermoplastic passivation layer.

In an embodiment, a second conductive layer may be formed over the micro device and passivation layer. For example, the second conductive layer can be formed by deposition and etching a material such as indium-tin-oxide (ITO) or indium-zinc-oxide (IZO). The second conductive layer can also be formed by ink jet printing a material such as poly(3,4-ethylenedioxythiophene) (PEDOT) or a material containing nanoparticles such as of silver, gold, ITO, and IZO nanoparticles. A barrier layer can be formed over the second conductive layer to protect against oxygen and moisture absorption, for example. Suitable deposition techniques include, but are not limited to, atomic layer deposition (ALD) and ion sputtering.

The A-staged thermoset passivation layer can be deposited using a variety of suitable techniques such as spin coating, screen printing, ink jet printing, dispending and spray coating, followed by the selective removal of a portion to expose an electrode line, for example by laser scribing or photolithography. Alternatively, a patterned A-staged thermoset passivation layer can be selectively applied so that the opening exposing the electrode line is included.

In an embodiment, placing the micro device on the conductive layer includes placing the micro device on a bonding layer formed on the conductive layer. For example, the bonding layer may include a material such as indium, gold, silver, molybdenum, tin, aluminum, silicon, and alloys thereof. The method may additionally include heating the structure to diffuse the bonding layer into the metal stack, or heating the structure to diffuse the bonding into a second bonding layer formed on the metal stack. Heating can be from a backside of the receiving substrate or from the transfer head, for example.

BRIEF DESCRIPTION OF THE DRAWINGS

FIG. 3D is a cross-sectional side view illustration of a transfer head holding a micro LED device over a receiving substrate with a patterned passivation layer in accordance with an embodiment of the invention.

FIGS. 13-14A are cross-sectional side view illustrations of attaching a cover plate and black matrix over a micro LED device on a receiving substrate in accordance with an embodiment of the invention.

DETAILED DESCRIPTION OF THE INVENTION

Figure 1A:
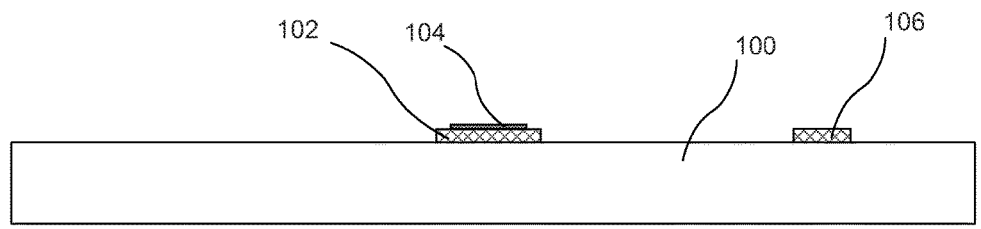
FIG. 1A is a cross-sectional side view illustration of a receiving substrate in accordance with an embodiment of the invention.

Embodiments of the present invention describe a method and structure for receiving a micro device or an array of micro devices such as micro light emitting diode (LED) devices on a receiving substrate. For example, the receiving substrate may be, but is not limited to, a display substrate, a lighting substrate, a substrate with functional devices such as transistors or integrated circuits (ICs), or a substrate with metal redistribution lines. While embodiments of the present invention are described with specific regard to micro LED devices comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "spanning," "over," "to," "between" and "on" as used herein may refer to a relative position of one layer with respect to other layers. One layer "spanning," "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED device as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales.

In one aspect, embodiments of the invention describe a manner for mass transfer of an array of pre-fabricated micro devices with an array of transfer heads. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 10 µm by 10 µm pitch, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

In another aspect, embodiments of the invention describe a method and structure for receiving a micro device or an array of micro devices on a receiving substrate. In an embodiment, a micro device or array of micro devices is transferred from a carrier substrate to a receiving substrate with a transfer head, or an array of transfer heads, which may be operated in accordance with electrostatic principles. Without being limited to a particular theory, embodiments of the invention utilize transfer heads and head arrays which operate in accordance with principles of electrostatic grippers, using the attraction of opposite charges to pick up micro devices. In accordance with embodiments of the present invention, a pull-in voltage is applied to a transfer head in order to generate a grip pressure on a micro device and pick up the micro device. In an embodiment, a grip pressure of greater than 1 atmosphere is generated. For example, each transfer head may generate a grip pressure of 2 atmospheres or greater, or even 20 atmospheres or greater without shorting due to dielectric breakdown of the transfer heads.

In one embodiment, placing the micro device or array of micro devices on the receiving substrate is performed with a punch-through technique in which the micro devices are placed on the receiving substrate by punching through a B-staged thermoset passivation layer. A final curing operation is then performed which may be associated with some amount of shrinking of the thermoset passivation layer that further retains the transferred array of micro devices on the receiving substrate during subsequent handling and processing operations. The term B-staged is known in the art and refers to an intermediate stage in a thermosetting material in which the material initially softens when heated but may not entirely fuse or dissolve. A B-staged material will cure upon continued heating. The term A-staged is also known in the art and refers to an early stage in a thermosetting material in which the material is fusible and still soluble in certain liquids.

In one embodiment, placing the micro device or array of micro devices on the receiving substrate is performed with a punch-through technique in which the micro devices are placed on the receiving substrate by punching through a thermoplastic passivation layer heated above the glass transition temperature (Tg) of the thermoplastic during punch-through. In an embodiment, the thermoplastic passivation layer is heated above the Tg and below the melting temperature (Tm) of the thermoplastic during punch-through. Following punch-through, the thermoplastic passivation layer is cooled, and may further retain the transferred array of micro devices on the receiving substrate during subsequent handling and processing operations.

Furthermore, where an active surface exists on a micro device, the passivation layer (thermoset or thermoplastic) can passivate the active surface. For example, where the micro device is a micro LED device, a quantum well layer may be exposed or contained near side surfaces of the micro LED device. In this manner, the passivation layer may laterally surround and insulate the quantum well layer as result of the punch-through operation.

In another aspect, embodiments of the invention describe a manner of combing the performance, efficiency, and reliability of wafer based electronics with the high yield, low cost, and mixed materials of thin film electronics to provide cost effect, energy efficient, high performance devices. In accordance with embodiments of the invention, micro arrays of semiconductor LED devices fabricated in accordance with wafer based processing can be transferred to existing and new thin film substrate technologies. Due to the small micro size and high efficiency of the micro LED devices significant power savings of 20 times or more can be realized compared to existing technologies. In an embodiment, a micro LED device is transferred to an active or passive matrix organic LED (OLED) backplane rather than forming a typical organic light emitting layer. In this manner, a finished display device can be fabricated that exhibits significant power savings, increased battery life, and reduced peak pixel current compared to traditional OLED display technologies.

FIG. 1A is a cross-sectional side view illustration of a receiving substrate in accordance with an embodiment of the invention. As illustrated, a first conductive layer 102 is formed on a substrate 100. An electrode line 106 may also be optionally formed on substrate 100. Substrate 100 may be a variety of substrates such as, but not limited to, a display substrate, a lighting substrate, a substrate with functional devices such as transistors or integrated circuits (ICs), or a substrate with metal redistribution lines. Depending upon the particular application, substrate 100 may be opaque, transparent, or semi-transparent to the visible wavelength (e.g. 380-750 nm wavelength), and substrate 100 may be rigid or flexible. For example, substrate 100 may be formed of glass or a polymer such as polyethylene terephthalate (PET), polyethelyne naphthalate (PEN), polycarbonate (PC), polyethersulphone (PES), aromatic fluorine-containing polyarylates (PAR), polycyclic olefin (PCO), and polyimide (PI). Depending upon the particular application, either or both of conductive layer 102 and electrode line 106 may be opaque, transparent, or semi-transparent to the visible wavelength. Exemplary transparent conductive materials include amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment conductive layer 102 is approximately 100 nm-200 nm thick ITO. In an embodiment, the conductive layer 102 includes nanoparticles such as silver, gold, aluminum, molybdenum, titanium, tungsten, ITO, and IZO. The conductive layer 102 or electrode line 106 may also be reflective to the visible wavelength. In an embodiment, a conductive layer 102 or electrode line 106 comprises a reflective metallic film such as aluminum, molybdenum, titanium, titanium-tungsten, silver, or gold, or alloys thereof.

In an embodiment, conductive layer 102 functions as an electrode or electrode line. In an embodiment, conductive layer 102 functions as an anode or anode line in the completed device, and electrode line 106 functions as a cathode line in the completed device. It is to be appreciated that conductive layer 102 are electrode line 106 are described as being related to the anode and cathode, respectively, in the following description, however, the application can be reversed in other embodiments with conductive layer 102 and electrode line 106 being related to the cathode and anode, respectively.

A bonding layer 104 may optionally be formed over the conductive layer 102 to facilitate bonding of the micro device as described in further detail below. In an embodiment, bonding layer 104 includes a material such as indium, gold, silver, molybdenum, tin, aluminum, silicon, or an alloy thereof and is approximately 0.1 μm to 0.5 μm thick. An electrode line 106 may also be optionally formed on substrate 100. The electrode line 106 may be formed of the same or different material from conductive layer 102. In an embodiment, electrode line 106 is a cathode line out the completed device.

Figure 1B:
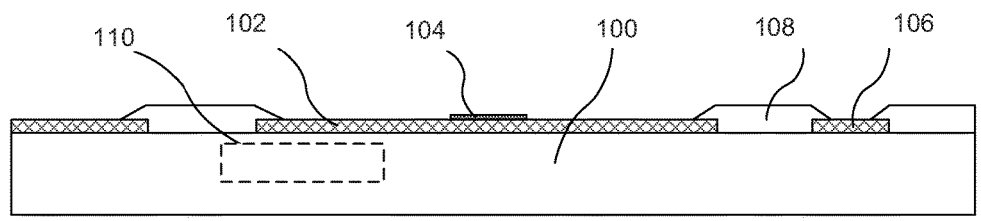
FIG. 1B is a cross-sectional side view illustration of a receiving substrate in accordance with an embodiment of the invention.

FIG. 1B is a cross-sectional side view illustration of a receiving substrate in accordance with an embodiment of the invention. In the particular embodiment illustrated, the receiving substrate 100 may be an active matrix organic LED (AMOLED) backplane prior to the formation of the light emitting organic layer. For example, the AMOLED backplane can include a working circuitry 110, such as a traditional 2T1C (two transistors, one capacitor) circuitry including a switching transistor, a driving transistor, and a storage capacitor. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for current distribution to the driver transistor and the micro device, or for their instabilities. A passivation layer 108 may optionally be formed on the substrate 100 between the conductive layer 102 (e.g. anode) and electrode line out 106 (e.g. cathode line out). Passivation layer 108 may be formed of a variety of materials such as, but not limited to, silicon oxide ($SiO_2$), silicon nitride ($SiN_x$), poly(methyl methacrylate) (PMMA), benzocyclobutene (BCB), polyimide, and polyester.

It is to be appreciated that embodiments of the invention are compatible with a number of different substrates, and that the substrates described with regard to FIGS. 1A-1B are meant to be exemplary and not limiting. In interest of conciseness and to not obscure embodiments of the invention, the following description is made with reference to the embodiment of the substrate illustrated in FIG. 1.

Figure 2:
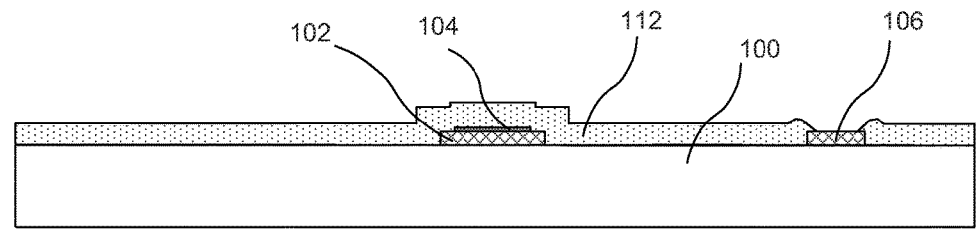
FIG. 2 is a cross-sectional side view illustration of a patterned passivation layer on a receiving substrate in accordance with an embodiment of the invention.

FIG. 2 is a cross-sectional side view illustration of a patterned passivation layer 112 on a receiving substrate 100 in accordance with an embodiment of the invention. In the particular embodiment illustrated, the patterned passivation layer 112 is patterned to expose the electrode line 106 (e.g. a cathode line out).

In an embodiment, the patterned passivation layer 112 is a B-staged thermoset. The B-staged thermoset passivation layer 112 may be formed by directly applying the B-staged thermoset passivation layer, or by first applying an A-staged thermoset passivation layer on the receiving substrate 100 and covering the conductive layer 102, and optionally electrode line 106, followed by driving off the solvents and partially curing the A-staged thermoset passivation layer to form the B-staged thermoset passivation layer. The A-staged or B-staged thermoset passivation layer may be formed by a variety of techniques including spin coating, screen printing, ink jet printing, dispensing, and spray coating, and may be formed of a variety of materials including, but not limited to benzocyclobutene (BCB) and epoxy. The rheology of the B-staged thermoset layer can be controlled by the amount of cross-linking in the B-staged thermoset to allow for punch-through of the micro device without excessive flow. An opening exposing the electrode line 106 may be formed during the A-stage application or B-stage application, such as with a screen printing or ink jet printing application, or alternatively when B-staged, where the opening may be formed by laser scribing or lithography. In an embodiment, a B-staged thermoset passivation layer is formed on the receiving substrate 100 with vacuum lamination.

In an embodiment, the patterned passivation layer 112 is a thermoplastic. The thermoplastic passivation layer 112 may be formed by a variety of techniques including spin coating, screen printing, ink jet printing, dispensing, and spray coating, and may be formed of a variety of materials in which the rheology of the thermoplastic between the Tg and Tm of the thermoplastic is sufficient to allow for punch-through of the micro device without excessive flow. An opening exposing the electrode line 106 may be formed during application of the patterned thermoplastic passivation layer, such as with a screen printing or ink jet printing application, or alternatively after application, where the opening may be formed by laser scribing or lithography. In an embodiment, a thermoplastic passivation layer is formed on the receiving substrate 100 with vacuum lamination.

Figure 3A:
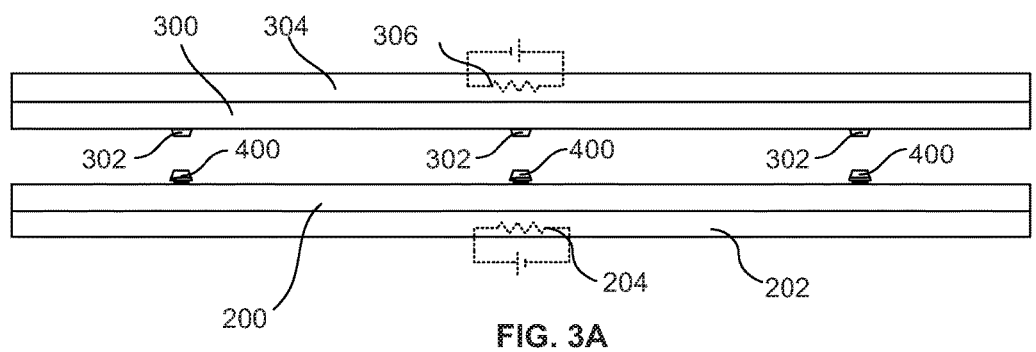
FIGS. 3A-3C are cross-sectional side view illustrations of an array of transfer heads picking up an array of micro LED devices from a carrier substrate in accordance with an embodiment of the invention.
Figure 3B:
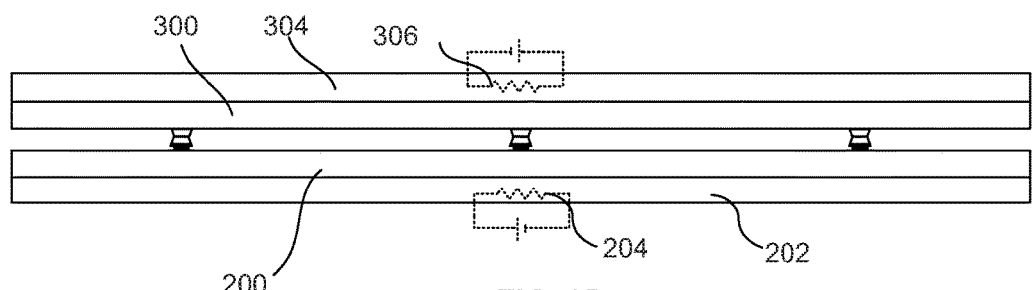
Figure 3C:
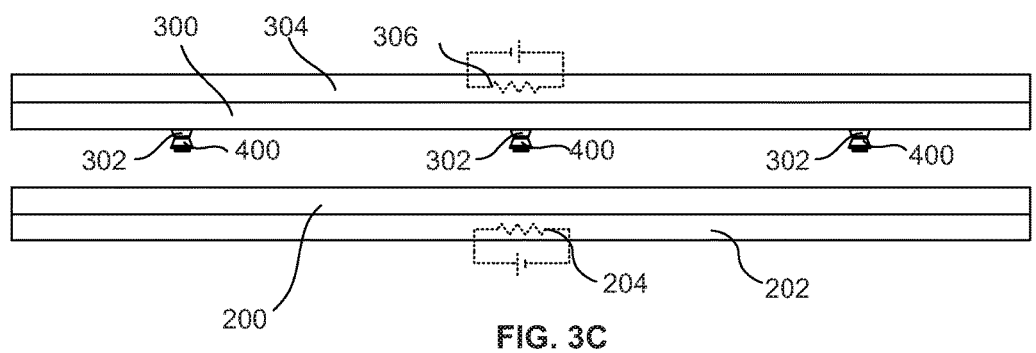

FIGS. 3A-3C are cross-sectional side view illustrations of an array of transfer heads picking up an array of micro devices from a carrier substrate in accordance with an embodiment of the invention. Referring to FIG. 3A, an array of transfer heads 302 supported by a transfer head substrate 300 are positioned over an array of micro devices 400 supported on a carrier substrate 200. A heater 306 and heat distribution plate 304 may optionally be attached to the transfer head substrate 300. A heater 204 and heat distribution plate 202 may optionally be attached to the carrier substrate 200. The array of micro devices 400 are contacted with the array of transfer heads 302, as illustrated in FIG. 3B, and picked up from the carrier substrate 200 as illustrated in FIG. 3C.

In an embodiment, the array of micro devices 400 are picked up with an array of transfer heads 302 operating in accordance with electrostatic principles. In an embodiment, a bonding layer (illustrated in further detail in FIG. 3A) may be formed between the array of micro devices 400 and the carrier substrate 200. In such an embodiment, heat may be applied to the bonding layer from either or both heaters 204, 306 prior to or during pick up to create a phase change in the bonding layer. For example, the bonding layer may be heated above a liquidus temperature of the bonding layer to create a phase change from solid to liquid state. In an embodiment, the bonding layer has a liquidus temperature of 350° C. or below, or more specifically 200° C. or below.

FIG. 3D is a cross-sectional side view illustration of a transfer head 302 holding a micro LED device 400 over a receiving substrate 100 with a patterned passivation layer 112 in accordance with an embodiment of the invention. In the embodiment illustrated, the transfer head 302 is supported by a transfer head substrate 300. As described above, a heater 306 and heat distribution plate 304 may optionally be attached to the transfer head substrate to apply heat to the transfer head 302. A heater 152 and heat distribution plate 150 may also, or alternatively, optionally be used to transfer heat to the conductive layer 102 and optional bonding layer 104 on the receiving substrate 100 and/or optional bonding layer 410 on a micro device 400 described below.

Still referring to FIG. 3D, a close-up view of an exemplary micro LED device 400 is illustrated in accordance with an embodiment. It is to be appreciated, that the specific micro LED device 400 illustrated is exemplary and that embodiments of the invention are not limited. For example, embodiments of the invention may also be applicable to other micro LED devices such as, but not limited to, the micro LED devices in U.S. patent application Ser. Nos. 13/372,222, 13/436,260, and 13/458,932, all of which are incorporated herein by reference. Embodiments of the invention may also be applicable to other micro devices including, but not limited to, other micro semiconductor devices which are designed in such a way so as to perform in a controlled fashion a predetermined electronic function (e.g. diode, transistor, integrated circuit) or photonic function (LED, laser).

In the particular embodiment illustrated, the micro LED device 400 includes a micro p-n diode 450 and a metallization stack 420. A bonding layer 410 may optionally be formed below the metallization stack 420, with the metallization stack 420 between the micro p-n diode 450 and the bonding layer 410. In an embodiment, the micro p-n diode 450 includes a top n-doped layer 414, one or more quantum well layers 416, and a lower p-doped layer 418. The micro p-n diodes can be fabricated with straight sidewalls or tapered sidewalls. In certain embodiments, the micro p-n diodes 450 possess outwardly tapered sidewalls 453 (from top to bottom). In certain embodiments, the micro p-n diodes 450 possess inwardly tapered sidewall (from top to bottom). The metallization stack 420 may include one or more layers. For example, the metallization stack 420 may include an electrode layer and a barrier layer between the electrode layer and the optional bonding layer. The metallization stack 420 may be transparent to the visible wavelength range (e.g. 380 nm-750 nm) or opaque. The metallization stack 420 may optionally include a reflective layer, such as a silver layer. The micro p-n diode and metallization stack may each have a top surface, a bottom surface and sidewalls. In an embodiment, the bottom surface 451 of the micro p-n diode 450 is wider than the top surface 452 of the micro p-n diode, and the sidewalls 453 are tapered outwardly from top to bottom. The top surface of the micro p-n diode 450 may be wider than the bottom surface of the p-n diode, or approximately the same width. In an embodiment, the bottom surface 451 of the micro p-n diode 450 is wider than the top surface of the metallization stack 420. The bottom surface of the micro p-n diode may also be approximately the same width as the top surface of the metallization stack.

A conformal dielectric barrier layer 460 may optionally be formed over the micro p-n diode 450 and other exposed surfaces. The conformal dielectric barrier layer 460 may be thinner than the micro p-n diode 450, metallization stack 420 and the optional bonding layer 410 so that the conformal dielectric barrier layer 260 forms an outline of the topography it is formed on. In an embodiment, the micro p-n diode 450 is several microns thick, such as 3 μm or 5 μm, the metallization stack 420 is 0.1 μm-2 μm thick, and the optional bonding layer 410 is 0.1 μm-1 μm thick. In an embodiment, the conformal dielectric barrier layer 460 is approximately 50-600 angstroms thick aluminum oxide ($Al_2O_3$). The conformal dielectric barrier layer 460 may protect against charge arcing between adjacent micro p-n diodes during the pick up process, and thereby protect against adjacent micro p-n diodes from sticking together during the pick up process. The conformal dielectric barrier layer 460 may also protect the sidewalls 453, quantum well layer 416 and bottom surface 451, of the micro p-n diodes from contamination which could affect the integrity of the micro p-n diodes. For example, the conformal dielectric barrier layer 460 can function as a physical barrier to wicking of the bonding layer material 410 up the sidewalls and quantum layer 416 of the micro p-n diodes 450. The conformal dielectric barrier layer 260 may also insulate the micro p-n diodes 450 once placed on the receiving substrate. In an embodiment, the conformal dielectric barrier layer 460 span sidewalls 453 of the micro p-n diode, and may cover the quantum well layer 416 in the micro p-n diode. The conformal dielectric barrier layer may also partially span the bottom surface 451 of the micro p-n diode, as well as span sidewalls of the metallization stack 420. In some embodiments, the conformal dielectric barrier layer also spans sidewalls of a patterned bonding layer 410. A contact opening may be formed in the conformal dielectric barrier layer 460 exposing the top surface 452 of the micro p-n diode. The contact opening 462 may have a smaller width than the top surface 452 of the micro p-n diode and the conformal dielectric barrier layer 460 forms a lip around the edges of the top surface 452 of the micro p-n diode. Alternatively the contact opening 462 may have a slightly larger width than the top surface of the micro p-n diode or approximately the same width as the top surface of the micro p-n diode. In an embodiment, a conformal dielectric barrier layer 260 is not present, and the passivation layer 112 is used to insulate the micro p-n diodes 450 once placed on the receiving substrate.

Figure 3E:
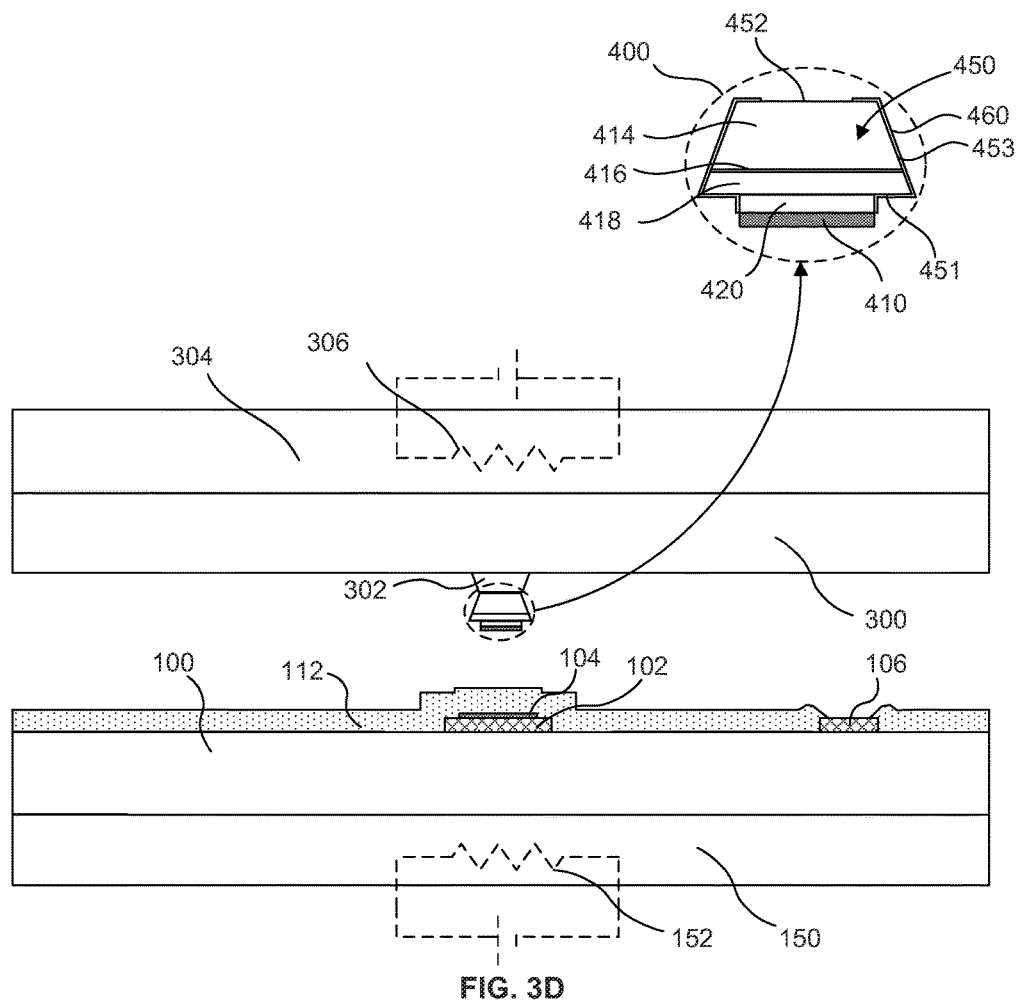
FIG. 3E is a cross-sectional side view illustration of an array of transfer heads holding an array micro LED devices over a receiving substrate with a patterned passivation layer in accordance with an embodiment of the invention.
Figure 3E:
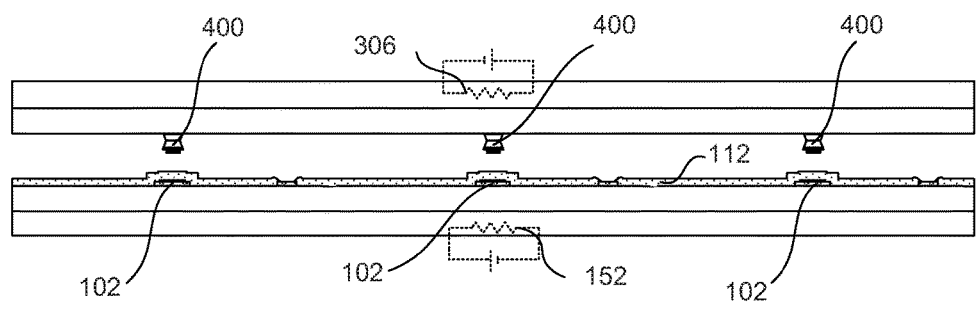

FIG. 3E is a cross-sectional side view illustration of an array of transfer heads holding an array micro LED devices 400 over a receiving substrate with a patterned passivation layer 112 in accordance with an embodiment of the invention. FIG. 3E is substantially similar to the structure illustrated in FIG. 3D with the primary difference being the illustration of the transfer of an array of micro devices as opposed to a single micro device within the array of micro devices.

Figure 4A:
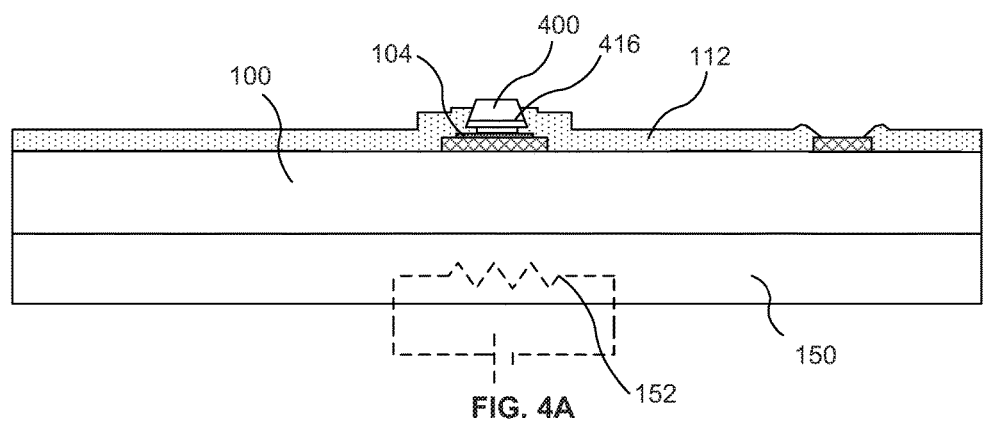
FIG. 4A is a cross-sectional side view illustration of a micro LED device punched through a passivation layer on a receiving substrate in accordance with an embodiment of the invention.

FIG. 4A is a cross-sectional side view illustration of a micro LED device punched through a passivation layer on a receiving substrate in accordance with an embodiment of the invention. Punch-through may be accomplished by physically driving the micro LED device 400 through the passivation layer 112 with the transfer head 302 until contacting the conductive layer 102 or optional bonding layer 104 on the receiving substrate 100. As illustrated, the micro LED device 400 may be punched-through the passivation layer 112 so that passivation layer 112 laterally surrounds the quantum well layer 416. The passivation layer 112 may also be thinner than the height of the micro LED device 400 so that electrical contact can be made with the top surface 452 of the micro LED device.

Punch-through may also be aided by the application of heat through the transfer head 302 or receiving substrate 100. In an embodiment where the passivation layer 112 is a UV curable or thermally curable B-staged thermoset, the application of heat can melt or soften the B-staged thermoset passivation layer 112 to aid in the punch-through. Thus, the amount of applied pressure, heat, and amount of cross-linking in the B-staged thermoset can be controlled to achieve punch-though. Application of UV energy after punch-through can then be used to cure the thermoset passivation layer 112 where the thermoset passivation layer 112 is UV curable. In an embodiment where the passivation layer 122 is a thermally curable B-staged thermoset, continued application of heat after punch-through can then be used to cure the thermoset passivation layer 112. In an embodiment, where the passivation layer 112 is a thermoplastic material the thermoplastic passivation layer 112 is heated above the Tg, and more specifically, above the Tg and below the Tm of the thermoplastic material during punch-through. Thus, the amount of pressure and heat applied to the thermoplastic material can be controlled to achieve punch-though.

In certain embodiments, the application of heat during punch-through can also result in reflowing of one or both of the optional bonding layers 410, 104 or diffusion between layers to assist with bonding. In addition, reflowing of any of the bonding layers 410, 104 can result in forming a new bonding layer with a higher melting temperature. In one embodiment, the application of heat not only aids with punch-through of layer 112, the application of heat also causes at least partial reflow and solidification of the bonding layers(s) 410, 104. For example, the application of heat can lead to the formation of an alloy having a higher Tm than that of the reflowed or diffused layer(s).

In an embodiment, the punch-through and release of the micro devices on the receiving substrate is performed in ten seconds or less, or more particularly one second or less. Where heat is applied, it is possible to rapidly reflow either of the optional bonding layer(s) 410, 104 to assist in bonding and to soften or initially melt the passivation layer 112, which can be a thermal or UV curable B-staged thermoset, or a thermoplastic. Following the release of the array of micro devices from the array of transfer heads, the passivation layer 112 is hardened to secure the array of micro devices on the receiving substrate. Where the passivation layer 112 is a thermoplastic, hardening is effected by allowing the thermoplastic material to cool. Where the passivation layer 112 is a B-staged thermoset, the passivation layer can be final cured through the application of UV energy or heat for an order of minutes or hours to effect curing. In an embodiment, heat can be applied from below the receiving substrate 100 with heater 152 and/or heat distribution plate 150. Heat can also be applied from above the receiving substrate 100. UV energy can also be applied from above or below the receiving substrate. In an embodiment, the receiving substrate is transferred to a curing chamber to effect curing following the release of the array of micro devices.

Figure 4B:
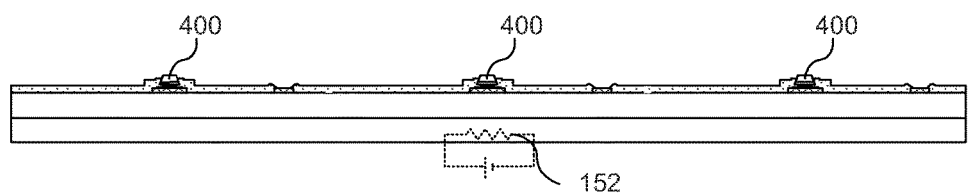
FIG. 4B is a cross-sectional side view illustration of an array of micro LED devices punched through a passivation layer on a receiving substrate in accordance with an embodiment of the invention.

FIG. 4B is a cross-sectional side view illustration of an array of micro LED devices punched through a passivation layer on a receiving substrate in accordance with an embodiment of the invention. FIG. 4B is substantially similar to the structure illustrated in FIG. 4A with the primary difference being the illustration of the transfer of an array of micro devices as opposed to a single micro device within the array of micro devices.

Figure 5:
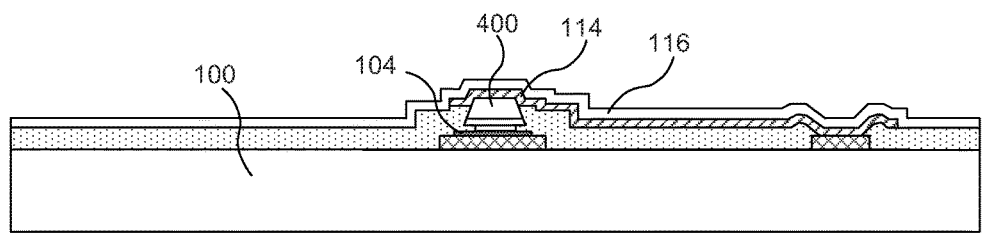
FIG. 5 is a cross-sectional side view illustration of a conductive layer and barrier layer formed over a micro LED device on a receiving substrate in accordance with an embodiment of the invention.

Referring now to FIG. 5, following hardening of the punched-through passivation layer 112 a second conductive layer 114 and optional barrier layer 116 may be formed over the micro LED device 400 and receiving substrate 100 in accordance with an embodiment of the invention. In an embodiment, the second conductive layer 114 is a transparent material such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the second conductive layer 114 includes nanoparticles such as silver, gold, aluminum, molybdenum, titanium, tungsten, ITO, and indium-zinc-oxide (IZO). The second conductive layer 114 may also be reflective to the visible wavelength. In an embodiment, a reflective conductive layer 114 comprises a metallic film such as aluminum, molybdenum, titanium, titanium-tungsten, silver, or gold, or alloys thereof. In an embodiment, an optional barrier layer 116 is formed over the second conductive layer 114. For example, the optional barrier layer 116 can act as a barrier to oxygen or moisture absorption by any underlying layers during subsequent processing. In an embodiment, barrier layer 116 is formed from an inorganic material (e.g. $SiO_xN_y$, $SiN_x$, $Al_2O_3$, etc.) for oxygen and moisture protection. Barrier layer 116 may also be transparent or opaque to the visible wavelength, and may be rigid or flexible. In an embodiment, the barrier layer 116 is $Al_2O_3$, and may be deposited by a variety of methods including atomic layer deposition (ALD).

Figure 6:
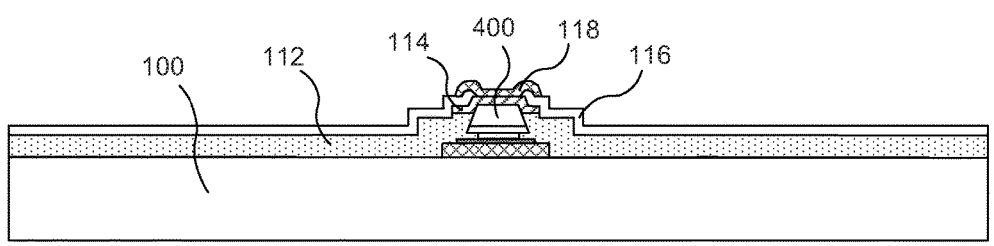
FIG. 6 is a cross-sectional side view illustration of a cathode line formed directly over a micro LED device on a receiving substrate in accordance with an embodiment of the invention.
Figure 7:
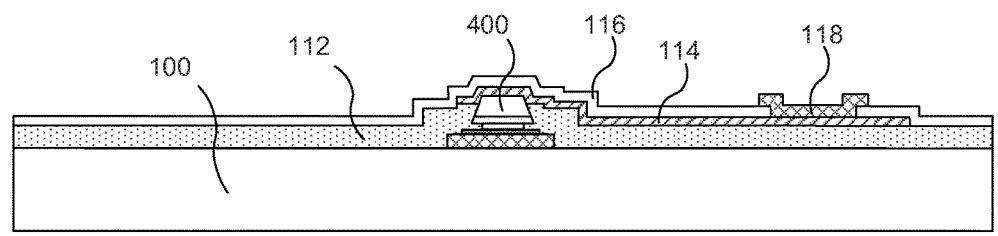
FIG. 7 is a cross-sectional side view illustration of a cathode line on a receiving substrate in accordance with an embodiment of the invention.

Referring now to FIG. 6 and FIG. 7, alternative embodiments are illustrated for forming an electrode line 118 (e.g. a cathode line out) where one is not already formed. Similar to electrode line 106, the electrode line 118 may function may be associated with an anode or cathode. In an embodiment, electrode line 118 is a cathode line out. Electrode line 118 may be formed of any of the materials already described with regard to layers 102, 106, and 114. FIG. 6 is an illustration of an embodiment in which an electrode line 118 is formed on conductive layer 114 directly over the micro LED device 400. In another embodiment electrode line 118 is formed directly on the micro LED device 400. FIG. 7 is an illustration of an embodiment in which electrode line 118 is formed on a trace portion of second conductive layer 114. In both embodiments, an opening may be formed in the optional barrier layer 116, if present, in order to expose the second conductive layer 114 prior to formation of the electrode line 118.

Figure 8:
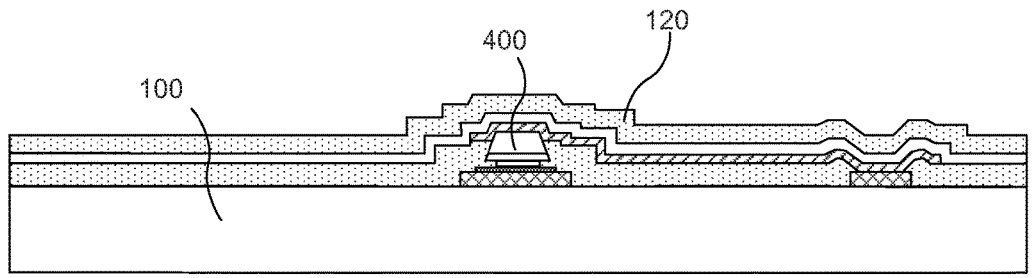
FIG. 8 is a cross-sectional side view illustration of cover layer formed over a micro LED device on a receiving substrate in accordance with an embodiment of the invention.

FIG. 8 is a cross-sectional side view illustration of cover layer 120 formed over the exemplary structure of FIG. 5 in accordance with an embodiment. In the particular embodiment illustrated the cover layer 120 is conformal to the topography of the micro LED device 400 and overall structure over substrate 100. Cover layer 120 may function to provide both chemical passivation and physical protection to the underlying structure. Cover layer 120 may also be flexible, and may be transparent. Cover layer 120 may be formed of a variety of materials such as, but not limited to, silicon oxide ($SiO_2$), silicon nitride ($SiN_x$), poly(methyl methacrylate) (PMMA), benzocyclobutene (BCB), polyimide, and polyester.

As described up to this point, the layers on which the micro LED device 400 are supported and covered by can be transparent or opaque to the visible wavelength. Accordingly, the structure illustrated in FIG. 8 can emit light through either the top cover 120, through the bottom substrate 100, or both depending on the selection of materials and type of substrate.

Figure 9:
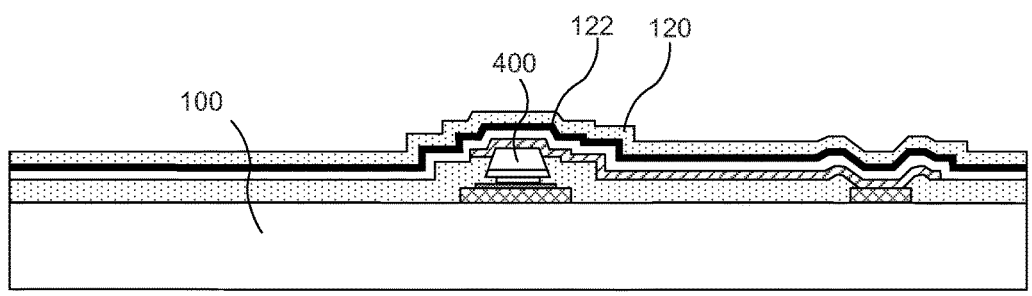
FIG. 9 is a cross-sectional side view illustration of a reflective layer and cover layer formed over a micro LED device on a receiving substrate in accordance with an embodiment of the invention.

FIG. 9 is a cross-sectional side view illustration an embodiment in which a reflective layer 122 is formed over the micro LED device 400 prior to formation of the top cover 120 to produce a bottom emitting structure. For example, reflective layer 122 can be evaporated or sputtered metallic material such as aluminum. In this manner, light emitting upward from the micro LED device 400 is reflected back through the bottom substrate 100. In such an embodiment, the metallic stack 420 and/or optional bonding layers 410/104 may be substantially transparent to the visible wavelength. Transparency can be controlled by the selection of materials and/or thickness of the layers.

Figure 10:
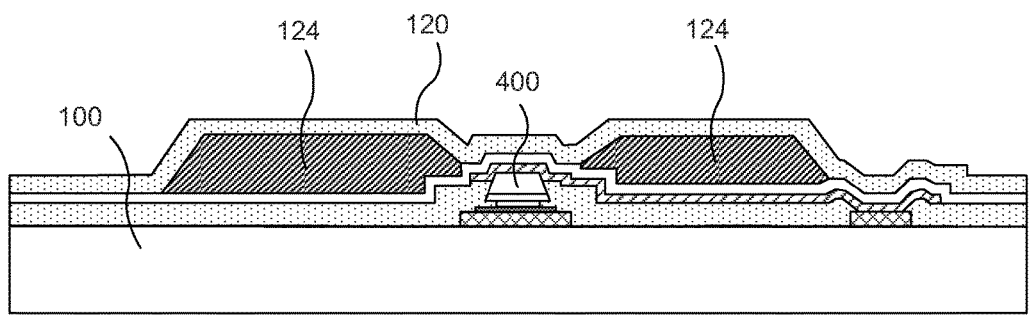
FIG. 10 is a cross-sectional side view illustration of a black matrix layer and cover layer formed over a micro LED device on a receiving substrate in accordance with an embodiment of the invention.

FIG. 10 is a cross-sectional side view illustration of an embodiment in which a black matrix layer 124 is formed around a micro LED device prior to formation of the top cover 120 in order to block light emission, and to separate light emission from the micro LED device 400 from one or more adjacent micro LED devices 400. In such an embodiment, the structure illustrated in FIG. 10 can emit light through either the top cover 120, through the bottom substrate 100, or both depending on the selection of materials and type of substrate. Black matrix 124 can be formed form a method that is appropriate based upon the material used. For example, black matrix 124 can be applied using ink jet printing, sputter and etching, spin coating with lift-off, or a printing method. Exemplary black matrix materials include carbon, metal films (e.g. nickel, aluminum, molybdenum, and alloys thereof), metal oxide films (e.g. chromium oxide), and metal nitride films (e.g. chromium nitride), organic resins, glass pastes, and resins or pastes including a black pigment or silver particles.

Figure 11:
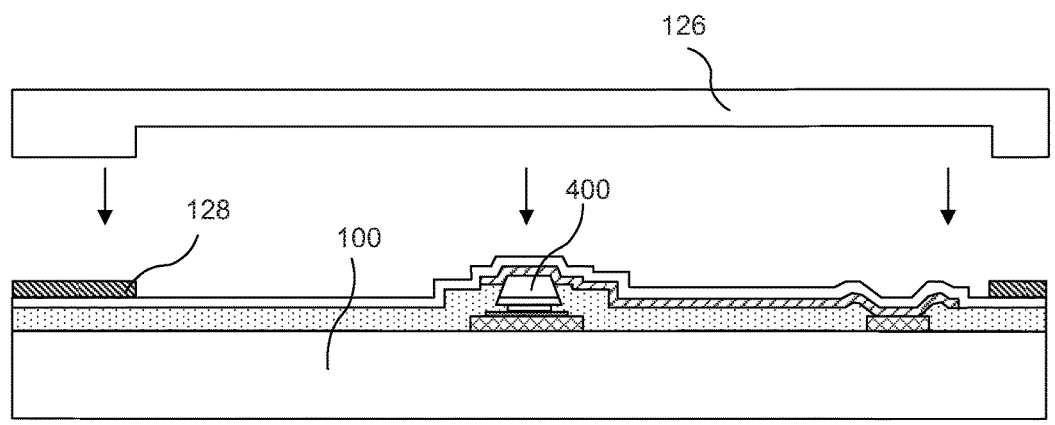
FIGS. 11-12 are cross-sectional side view illustrations of attaching a cover plate over a micro LED device on a receiving substrate in accordance with an embodiment of the invention.
Figure 12:
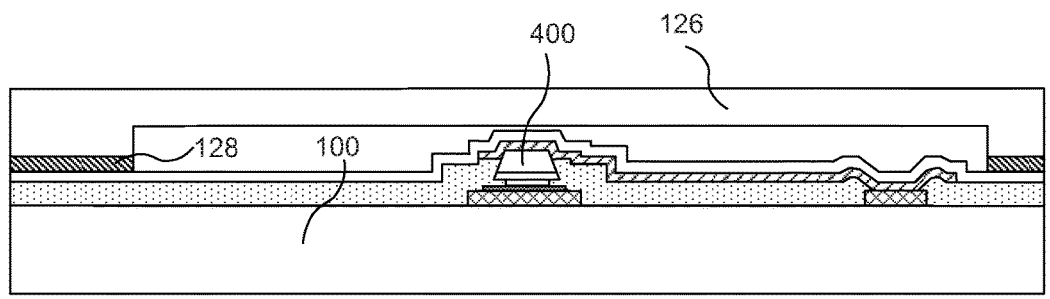

While cover 120 has been described as being conformal to the topography of the underlying structure, a separate cover plate can also be secured to the structure in combination with cover 120, or in the alternative to cover 120 in accordance with embodiments of the invention. FIGS. 11-12 are cross-sectional side view illustrations of attaching a cover plate 126 over a micro LED device 400 on a receiving substrate 100 in accordance with an embodiment of the invention. As illustrated, cover plate 126 can be attached to the substrate 100 with an adhesive 128 and may surround a plurality of pixels on the substrate 100. For example, adhesive 128 can be, but is not limited to, a frit glass seal or epoxy formed along the edge of the cover with a dispenser or screen printing. Cover 126 can be provided in place of or in combination with cover 120. In an embodiment, cover plate 126 is transparent glass or plastic.

Figure 13:
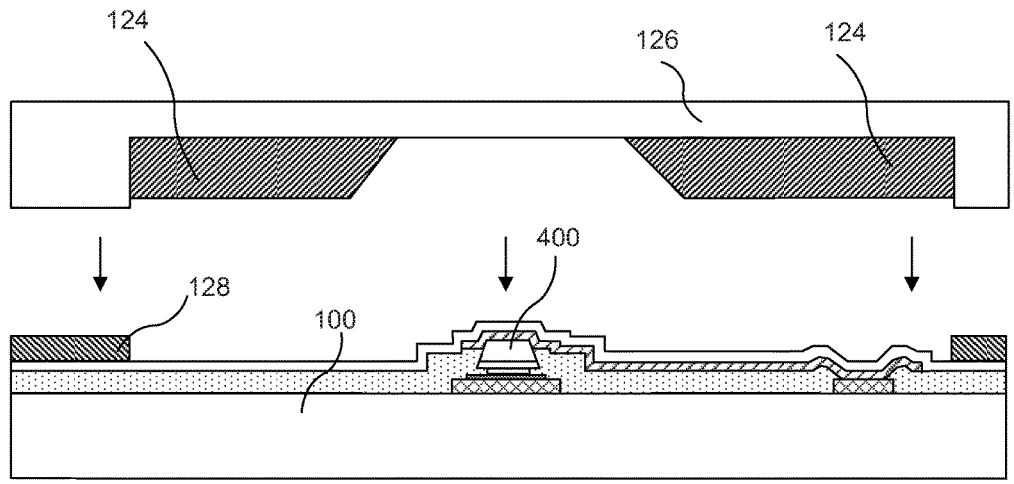
Figure 14A:
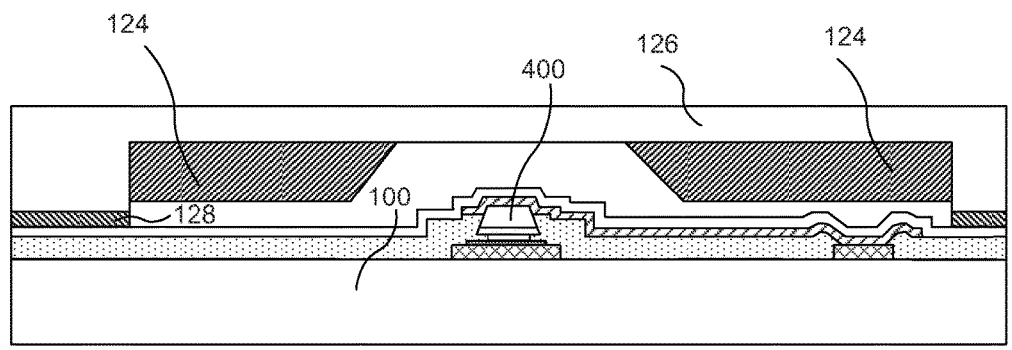
Figure 14B:
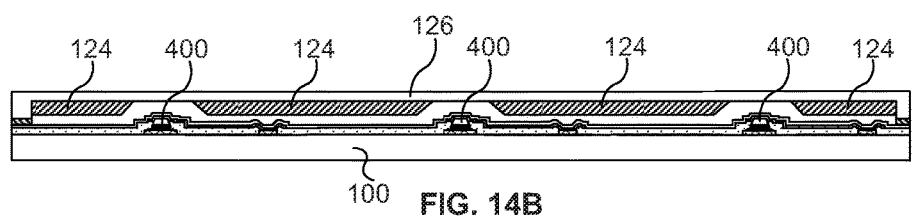
FIG. 14B is a cross-sectional side view illustration of a cover plate and black matrix over an array of micro LED devices on a receiving substrate in accordance with an embodiment of the invention.

FIGS. 13-14A are cross-sectional side view illustrations of attaching a cover plate 126 over a micro LED device 400 on a receiving substrate 100 in accordance with an embodiment of the invention. FIGS. 13-14A are similar to FIGS. 11-12 with one difference being that a black matrix 124 is attached to the cover plate 126 prior to attaching the cover plate 126 to the substrate 100. FIG. 14B is a cross-sectional side view illustration of a cover plate 126 and black matrix 124 over an array of micro LED devices 400 on a receiving substrate in accordance with an embodiment of the invention. As illustrated, cover plate 126 is attached to the substrate 100 with an adhesive 128 surrounding a plurality of pixels on the substrate. In the embodiment illustrated, the black matrix 124 is patterned on the cover plate 126 and includes a plurality of openings corresponding to locations directly above the locations of the micro LED devices 400 on substrate 100.

Figure 15:
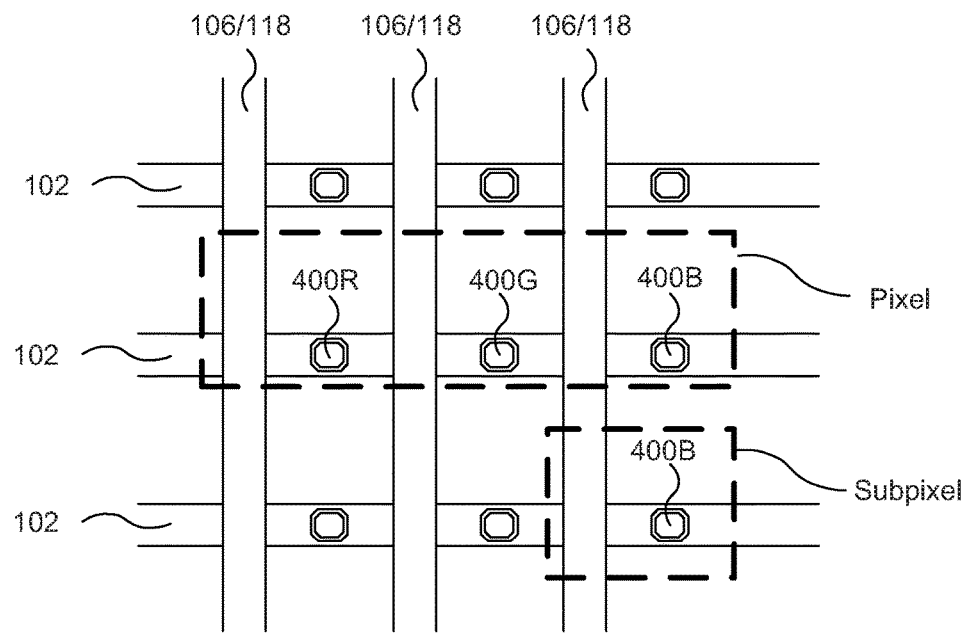
FIGS. 15-17 are schematic illustrations of passive matrix display layouts in accordance with embodiments of the invention.
Figure 16:
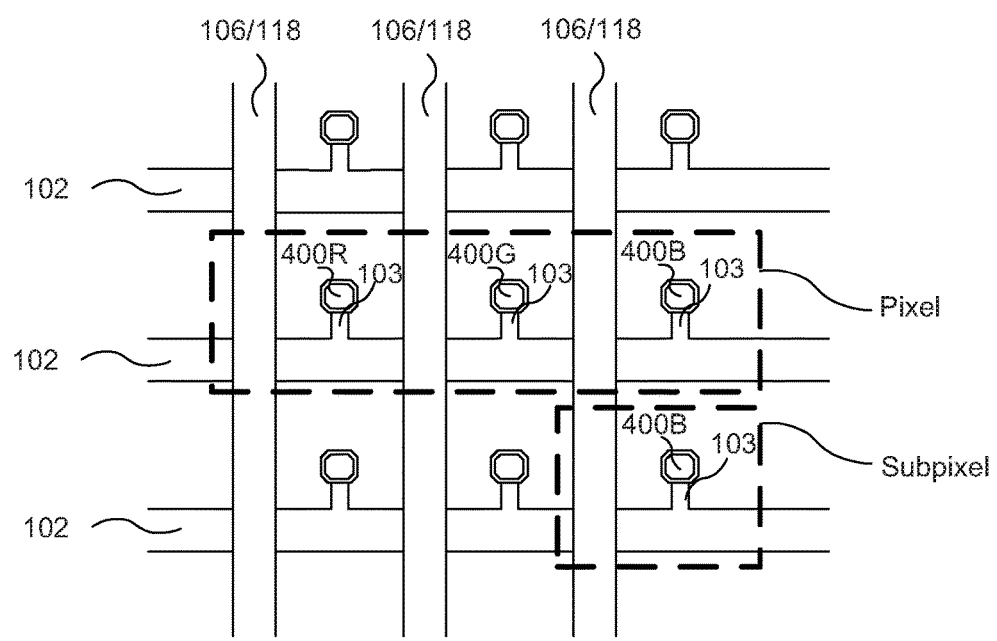
Figure 17:
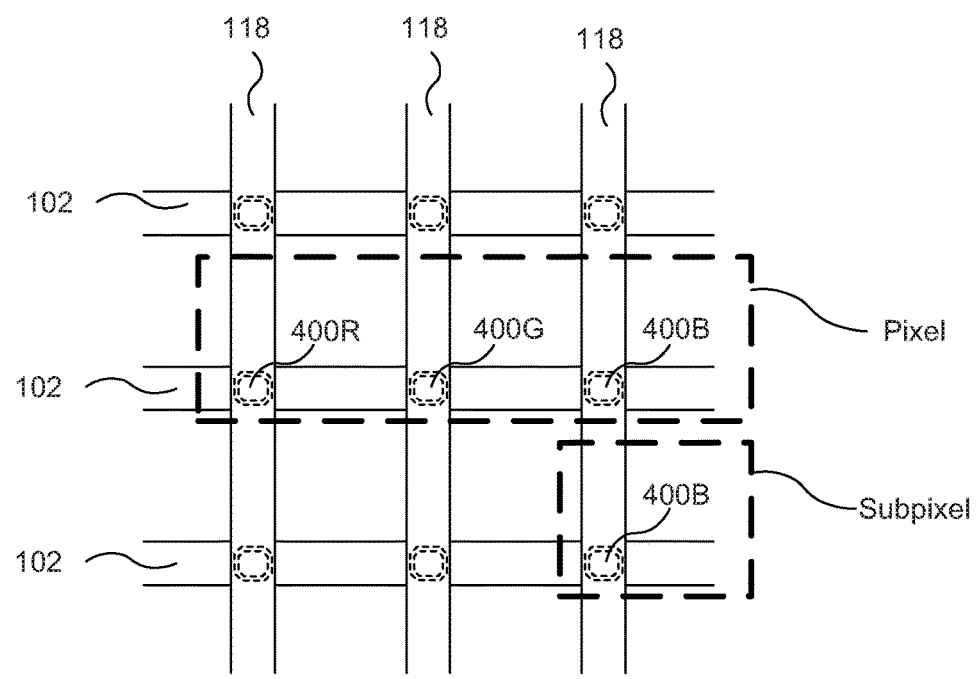

FIGS. 15-17 are schematic illustrations of passive matrix display layouts in accordance with embodiments of the invention. As illustrated, a pixel can include an array of subpixels. In the particular embodiments illustrated, each pixel comprises three subpixels, one with a red emitting LED device 400R, one with a blue emitting LED device 400B, and one with a green emitting LED device 400G. For example, a red emitting LED device 400R (e.g. 620-750 nm wavelength) can include a micro p-n diode layer formed of a semiconductor material such as aluminum gallium arsenide (AlGaAs), gallium arsenide phosphide (GaAsP), aluminum gallium indium phosphide (AlGaInP), and gallium phosphide (GaP). For example, a green emitting LED device 400G (e.g. 495-570 nm wavelength) can include a micro p-n diode layer formed of a semiconductor material such as indium gallium nitride (InGaN), gallium nitride (GaN), gallium phosphide (GaP), aluminum gallium indium phosphide (AlGaInP), and aluminum gallium phosphide (AlGaP). For example, a blue emitting LED device 400B (e.g. 450-495 nm wavelength) can include a micro p-n diode layer formed of a semiconductor material such as gallium nitride (GaN), indium gallium nitride (InGaN), and zinc selenide (ZnSe).

While the following pixel and subpixel arrangements are described with regard to a red-green-blue (RGB) subpixel arrangement, it is to be appreciated that the RGB arrangement is exemplary and that embodiments are not so limited. Other subpixel arrangements such as BGR or red-green-blue-yellow (RGBY), red-green-blue-yellow-cyan (RGBYC) can be utilized, as well subpixel rendering configurations in accordance with embodiments of the invention.

Referring now to FIG. 15, in the embodiment illustrated the LED devices 400R, 400G, 400B are placed on the first conductive layer 102 (e.g. anode line out). The LED devices are connected to the electrode line 106, 118 (e.g. cathode line out) by second conductive layer 114, for example as described above with regard to FIG. 5 or FIG. 7. Referring to FIG. 16, in the embodiment illustrated the LED devices 400R, 400G, 400B are placed on an electrode trace 103 connected with the first conductive layer 102. Similar to FIG. 15, the LED devices are connected to the electrode line 106, 118 by second conductive layer 114, for example as described above with regard to FIG. 5 or FIG. 7. Referring to FIG. 17, in the embodiment illustrated, the LED devices 400R, 400G, 400B are placed on the first conductive layer 102, and the electrode line 118 is formed over the LED devices, for example as described above with regard to FIG. 6.

Figure 18:
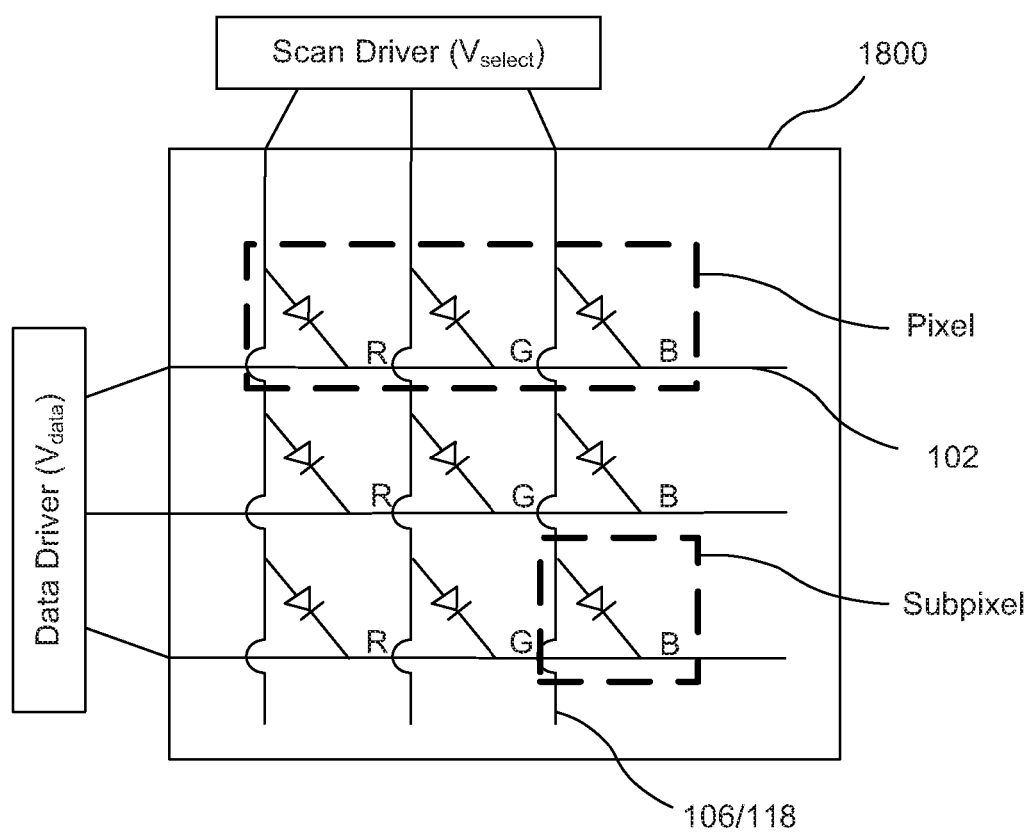
FIG. 18 is a circuit diagram of a passive matrix display in accordance with an embodiment of the invention.

A circuit diagram of a passive matrix display 1800 for any of the arrangements in FIGS. 15-17 is illustrated in FIG. 18 in accordance with an embodiment of the invention. As illustrated, the anode lines out 102 are oriented horizontally, the cathode lines out 106, 118 are oriented vertically, and the LED devices are placed between the lines. The cathode lines out 106, 118 function as data lines, and are driven by one or more data drivers. The anode lines out 102 function as scan lines, and are driven by one or more scan drivers.

Figure 19:
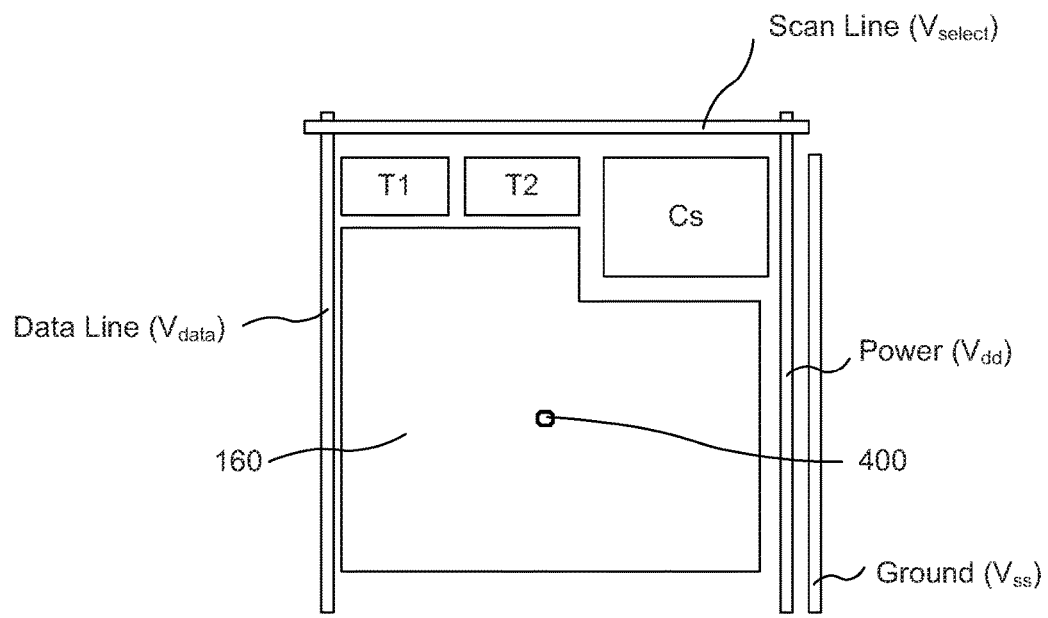
FIG. 19 is a schematic illustration of a subpixel in an active matrix display in accordance with embodiments of the invention.

FIG. 19 is a schematic illustration of a subpixel in an active matrix display in accordance with embodiments of the invention. More particularly, FIG. 19 illustrates an embodiment of a micro LED device 400 placed in an aperture 160 over the anode 102 (e.g. ITO layer) of an AMOLED backplane subpixel including working circuitry such as a traditional 2T1C (two transistors, one capacitor) circuitry including a switching transistor T1, a driving transistor T2, and a storage capacitor Cs. It is to be appreciated that the 2T1C circuitry is meant to be exemplary, and that other types of circuitry or modifications of the traditional 2T1C circuitry are contemplated in accordance with embodiments of the invention.

As illustrated, the micro LED device 400 may occupy less than the available space of the aperture 160 depending upon application. Table 1 below includes calculations of diagonal pixel size based upon pixel density, along with minimum subpixel size estimation with an RGB pixel layout in accordance with embodiments of the invention. In these examples, minimum subpixel size is approximated as being one third of the diagonal pixel size. It is to be appreciated that this number represents a minimum estimation, and is dependent upon the subpixel arrangement and landscape of the working circuitry.

TABLE 1

| Pixel Density (per inch) | Diagonal Pixel Size (μm) | Minimum Subpixel Size (μm) |
| --- | --- | --- |
| 500 | 51 | 17 |
| 300 | 85 | 28 |
| 200 | 127 | 42 |
| 100 | 254 | 85 |

Where a display has a pixel density of 100 pixels per diagonal inch (e.g. a computer monitor), this corresponds to a diagonal pixel size of 254 microns. With an RGB pixel layout, a subpixel illustrated in FIG. 19 is estimated to have a diagonal size of at least 85 microns. Where the display has a pixel density of 300 pixels per diagonal inch (e.g. a mobile phone, tablet) this corresponds to a diagonal pixel size of 85 microns. With an RGB pixel layout, a subpixel illustrated in FIG. 19 is estimated to have a diagonal size of at least 28 microns. Thus, as shown in Table 1 displays including substrates receiving micro LED devices in accordance with embodiments of the invention may be scalable down to pixel densities greater than the maximum resolution of a perfect human eye, which is estimated as being somewhere between 300 and 500 pixels per inch.

Figure 20:
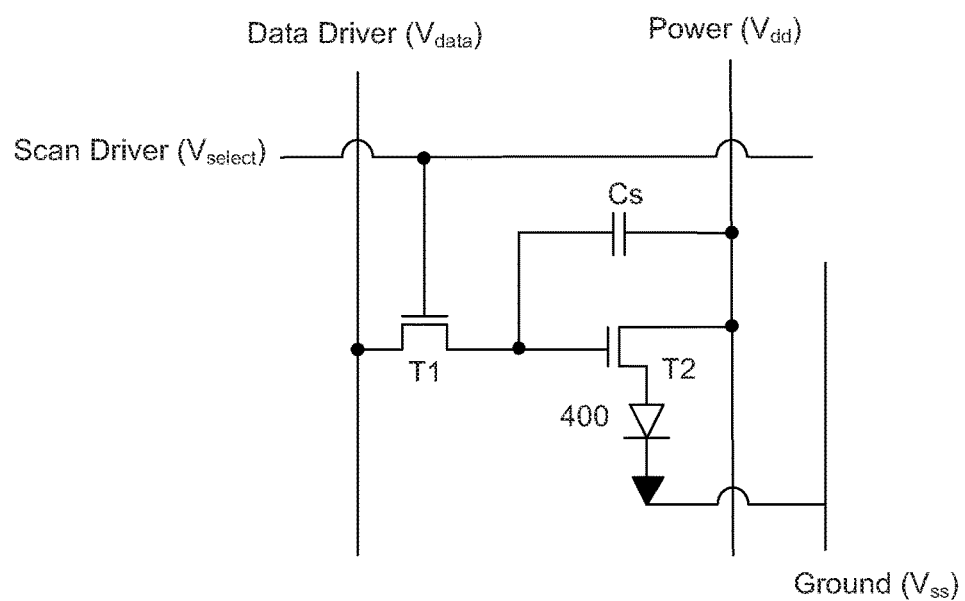
FIG. 20 is a circuit diagram of a subpixel in an active matrix display in accordance with an embodiment of the invention.

FIG. 20 is a circuit diagram of a subpixel with 2T1C circuitry in an active matrix display in accordance with an embodiment of the invention. In such an embodiment, the circuit includes a switching transistor T1, a driving transistor T2, a storage capacitor Cs and a micro LED device 400. The transistors T1, T2 can be any type of transistor such as a thin film transistor. For example, the switching transistor T1 can be a n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro LED device 400 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro LED device 400 can emit light based on the current. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for current distribution to the driver transistor and the micro device, or for their instabilities.

Figure 21:
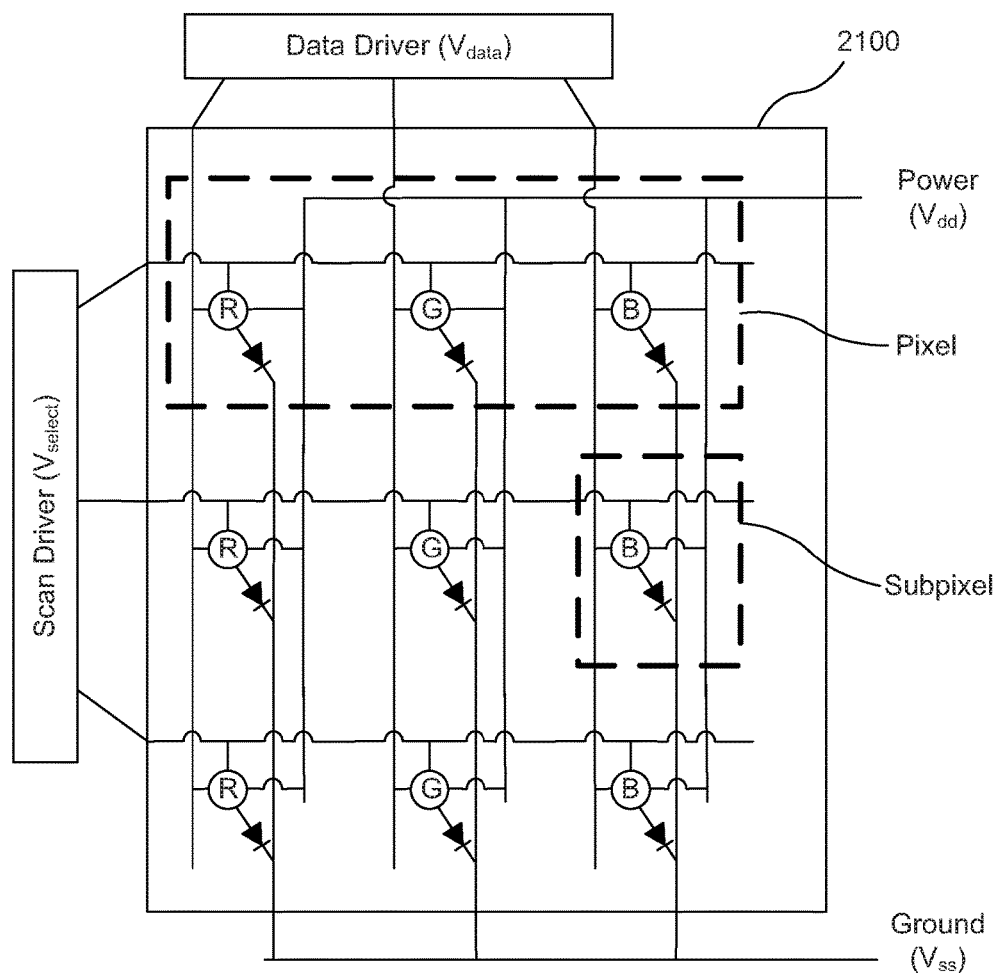
FIG. 21 is a circuit diagram of an active matrix display in accordance with an embodiment of the invention.

FIG. 21 is a circuit diagram of a pixel in an active matrix display 2100 in accordance with an embodiment of the invention. As illustrated, the scan lines $V_{select}$ are oriented horizontally and a driven by one or more scan drivers, and data lines $V_{data}$ are oriented vertically and are driven by one or more data drivers. The red, green, and blue light emitting micro LED devices are placed between the scan lines and data lines.

Figure 22:
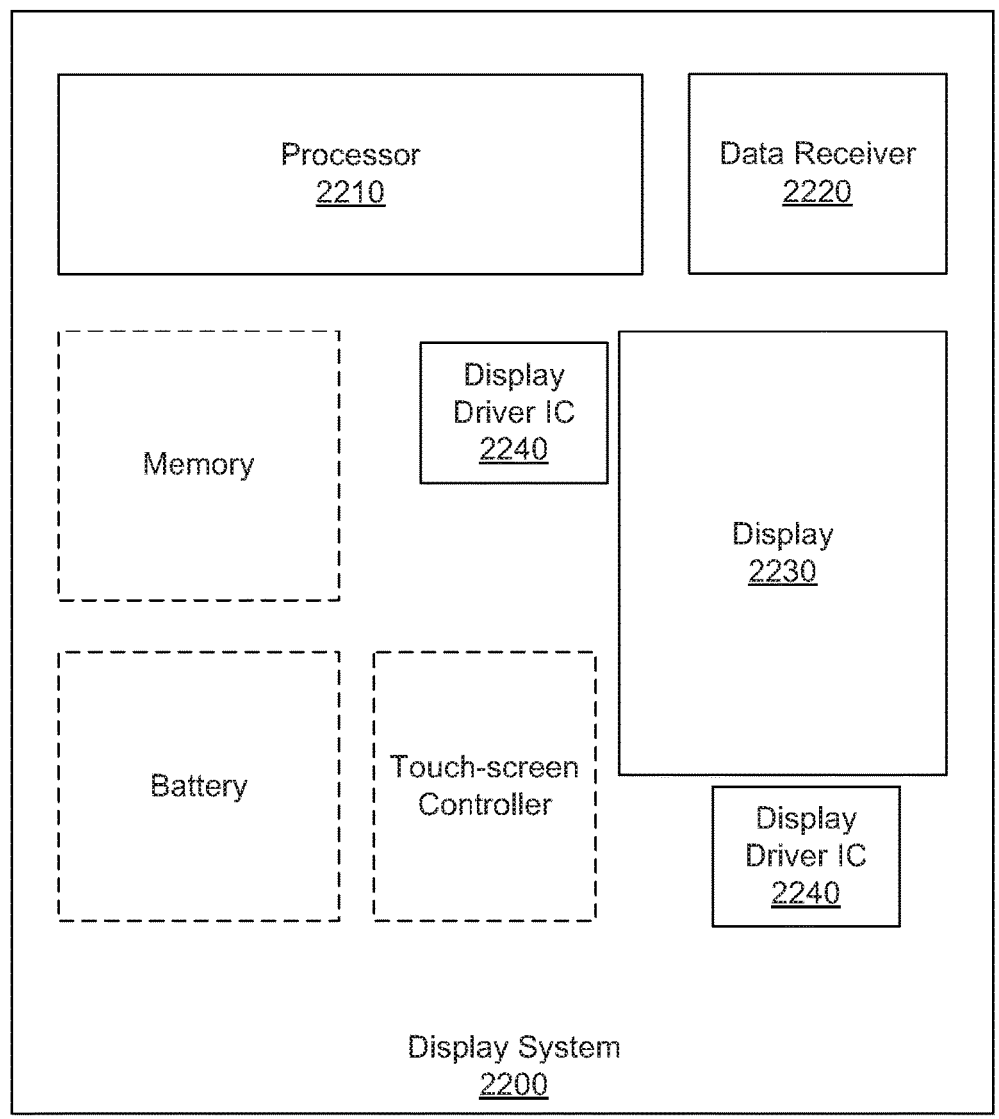
FIG. 22 is a schematic illustration of a display device in accordance with an embodiment of the invention.

FIG. 22 illustrates a display system 2200 in accordance with an embodiment. The display system houses a processor 2210, data receiver 2220, a display 2230, and one or more display driver ICs 2240, which may be scan driver ICs and data driver ICs. The data receiver 2220 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 2240 may be physically and electrically coupled to the display 2230.

In some embodiments, the display 2230 includes one or more micro LED devices 400 that are formed in accordance with embodiments of the invention described above. For example, the display 2230 may include pixels or subpixels in which a micro LED device 400 is received by passivation layer 112 laterally surrounding the quantum well layer of the micro LED device.

Depending on its applications, the display system 2200 may include other components. These other components include, but are not limited to, memory, a touch-screen controller, and a battery. In various implementations, the display system 2200 may be a television, tablet, phone, laptop, computer monitor, kiosk, digital camera, handheld game console, media display, ebook display, or large area signage display.

In utilizing the various aspects of this invention, it would become apparent to one skilled in the art that combinations or variations of the above embodiments are possible for receiving a micro device. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A display comprising:
   a substrate;
   a first bottom electrode line on the substrate;
   a passivation layer over the display substrate;
   a first plurality of vertical semiconductor-based light emitting diodes (LEDs) coupled with the first bottom electrode line and embedded within the passivation layer such that the passivation layer laterally surrounds a quantum well within each of the first plurality of vertical semiconductor-based LEDs;
   a second plurality of vertical semiconductor-based LEDs embedded within the passivation layer such that the passivation layer laterally surrounds a quantum well within each of the second plurality of vertical semiconductor-based LEDs, wherein the second plurality of vertical semiconductor-based LEDs and the first plurality of vertical semiconductor-based LEDs share a same vertical semiconductor-based LED; and
   a first top electrode line in electrical contact with the second plurality of vertical semiconductor-based LEDs.

2. The display of claim 1, wherein the first bottom electrode line is coupled with a driving circuit.

3. The display of claim 2, wherein the first plurality of vertical semiconductor-based light emitting diodes (LEDs) is designed for a first color emission.

4. The display of claim 2, wherein the first top electrode line is formed of a transparent conductive oxide material and is directly over the second plurality of vertical semiconductor-based LEDs.

5. The display of claim 2, further comprising one or more transparent conductor layers directly over and electrically connecting the second plurality of vertical semiconductor-based LEDs to the first top electrode layer.

6. The display of claim 3, wherein the second plurality of vertical semiconductor-based light emitting diodes (LEDs) includes the same vertical semiconductor-based LED designed for the first color emission and a second LED designed for a second color emission different from the first color emission.

7. The display of claim 6, wherein the first color emission is blue, and the second color emission is green.

8. The display of claim 6, wherein the second LED designed for the second color emission is coupled with a second bottom electrode line on the substrate.

9. The display of claim 8, wherein the first plurality of vertical semiconductor-based LEDs is bonded to first bottom electrode line with a corresponding plurality of bonding layers, and the second LED is bonded to the second bottom electrode line with a corresponding bonding layer.

10. The display of claim 9, wherein each bonding layer is an alloy bonding layer.

11. The display of claim 10, wherein each alloy bonding layer is an alloy of a first bonding layer on a corresponding vertical semiconductor-based LED with a second bonding layer on a corresponding first or second bottom electrode line.

12. The display of claim 11, wherein the alloy bonding layer has a higher melting temperature than both of the first bonding layer and the second bonding layer.

13. The display of claim 1, wherein the passivation layer comprises a thermoset material.

14. The display of claim 1, wherein the first top electrode line is connected to ground.

15. The display of claim 1, wherein each vertical semiconductor-based LED comprises sidewalls and a conformal dielectric barrier layer spanning along the sidewalls.

16. The display of claim 15, wherein the conformal dielectric barrier layer is 50-600 angstroms thick.

17. The display of claim 1, wherein the display substrate has a pixel density of greater than 300 pixels per inch.

18. The display of claim 17, wherein each vertical semiconductor-based LED has a maximum width of 1 to 100 μm.

19. The display of claim 1, further comprising a second passivation layer over the substrate and underneath the passivation layer.

20. The display of claim 19, wherein the second passivation layer comprises a material selected form the group consisting of silicon oxide ($SiO_2$), silicon nitride ($SiN_x$), poly(methyl methacrylate) (PMMA), benzocyclobutene (BCB), polyimide, and polyester.

* * * * *